(12) United States Patent
Athas et al.

(10) Patent No.: US 9,819,306 B2
(45) Date of Patent: *Nov. 14, 2017

(54) EFFICIENCY OF CLIPPED PULSE GENERATION

(71) Applicant: Apple Inc., Cupertino, CA (US)

(72) Inventors: William C. Athas, San Jose, CA (US); Catherine S. Chou, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/211,083

(22) Filed: Jul. 15, 2016

(65) Prior Publication Data

US 2017/0012583 A1   Jan. 12, 2017

Related U.S. Application Data

(63) Continuation of application No. 13/527,477, filed on Jun. 19, 2012, now Pat. No. 9,413,292.

(51) Int. Cl.
*H03B 5/12* (2006.01)

(52) U.S. Cl.
CPC ......... *H03B 5/1234* (2013.01); *H03B 5/1212* (2013.01); *H03B 5/1228* (2013.01)

(58) Field of Classification Search
CPC .... H02M 3/335; H03B 5/1212; H03B 5/1228
See application file for complete search history.

(56) References Cited

U.S. PATENT DOCUMENTS

| | | |
|---|---|---|
| 5,559,478 A | 9/1996 | Athas |
| 7,265,641 B2 | 9/2007 | Schulz |
| 7,345,894 B2 | 3/2008 | Sawtell |
| 9,413,292 B2 * | 8/2016 | Athas ................. H03B 5/1228 |
| 2006/0120115 A1 | 6/2006 | Chen |
| 2011/0032043 A1 | 2/2011 | Athas |

* cited by examiner

*Primary Examiner* — Jeffrey Shin
(74) *Attorney, Agent, or Firm* — Blank Rome LLP

(57) ABSTRACT

The disclosed embodiments provide a resonant oscillator circuit. The resonant oscillator circuit includes a clipping mechanism configured to clip an output voltage of a signal pulse generated by the resonant oscillator circuit to a predefined constant level. The resonant oscillator circuit also includes a feedback path configured to return energy from the clipping mechanism to an input of the resonant oscillator circuit.

20 Claims, 4 Drawing Sheets

EFFICIENCY OF CLIPPED PULSE GENERATION

BACKGROUND

Field

The disclosed embodiments relate to resonant oscillator circuits. More specifically, the disclosed embodiments relate to techniques for improving the efficiency of clipped pulse generation using resonant oscillator circuits.

Related Art

Oscillator circuits are commonly used to generate pulses in electrical systems. However, commonly used oscillator circuits can consume a significant amount of power, which is a disadvantage for systems in which reduced power consumption is desired, such as portable computing devices. To solve this problem, "resonant oscillator circuits," which transfer energy back and forth between inductive and capacitive circuit elements, can be used to generate clock pulses without dissipating a significant amount of power. (For example, see U.S. Pat. No. 5,559,478, entitled "Highly Efficient, Complementary, Resonant Pulse Generation," by inventor William C. Athas, filed 17 Jul. 1995.)

In the above-described resonant oscillator circuit, a stream of resonant pulses with a substantially sinusoidal shape is generated, and a switching device is used to clamp the output voltage of the resonant oscillator circuit to ground on the falling edge of each pulse when the pulse potential reaches zero volts. Input voltage across the resonant oscillator circuit's inductor and the switching on of the switching device may then reverse the inductor current from a negative value at the end of a pulse to a positive value determined by the duration of the switching device's on-time. In addition, the peak voltage of the resonant pulses may be determined by the amount of current in the resonant oscillator circuit's inductor at the time at which the switching device is turned off.

It is also highly desirable to hold the amplitude (i.e., peak voltage) of the pulses to a predefined constant level, in much the same way that the low signal level of the pulses is held constant. Design constraints on the peak voltage (e.g., from the load circuit driven by the pulses) may be one reason for clipping the output pulses. For example, the pulses may be used to drive a set of metal-oxide-semiconductor field-effect transistors (MOSFETs) with maximum operating voltage ratings. The pulses may thus be clipped to the MOSFETs' rated maximum operating voltage to mitigate degradation and/or reduced reliability in the MOSFETs.

To clip the pulses, a nonlinear element such as a Zener diode may be coupled to the output of the resonant oscillator circuit. In turn, the amplitude of the pulses may be clipped to the Zener voltage of the Zener diode. However, the Zener diode may dissipate power that normally oscillates between the load and the resonant oscillator circuit, thus increasing the power consumption and reducing the efficiency of the resonant oscillator circuit.

Hence, what is needed is a mechanism for increasing the efficiency of a resonant oscillator circuit that generates clipped pulses.

SUMMARY

The disclosed embodiments provide a resonant oscillator circuit. The resonant oscillator circuit includes a clipping mechanism configured to clip an output voltage of a signal pulse generated by the resonant oscillator circuit to a predefined constant level. The resonant oscillator circuit also includes a feedback path configured to return energy from the clipping mechanism to an input of the resonant oscillator circuit.

In some embodiments, the resonant oscillator circuit also includes a capacitor configured to store the energy from the clipping mechanism prior to returning the energy to the input along the feedback path.

In some embodiments, the clipping mechanism includes at least one of a first diode and a metal-oxide-semiconductor field-effect transistor (MOSFET).

In some embodiments, the clipping mechanism is further configured to rectify the signal pulse and enable charging of the capacitor using the signal pulse.

In some embodiments, the feedback path includes at least one of a Zener diode and a buck regulator.

In some embodiments, the feedback path further includes a second diode configured to prevent forward conduction in the Zener diode.

In some embodiments, the resonant oscillator circuit also includes
  (i) an inductor coupled to the input and a capacitive load, wherein the inductor is configured to act together with the capacitive load to generate the signal pulse; and
  (ii) a switching device configured to clamp the output voltage to ground when the output voltage reaches zero volts.

In some embodiments, the capacitive load includes a gate of a MOSFET. The clipping mechanism may clip the output voltage to a maximum operating voltage of the gate, thus allowing the MOSFET to be used in the capacitive load in lieu of a larger, more expensive, and/or less efficient MOSFET with a higher maximum operating voltage.

The disclosed embodiments also provide a pulse-generating circuit. The pulse-generating circuit includes an inductor coupled to an input voltage and a capacitive load, wherein the inductor is configured to act together with the capacitive load to generate a signal pulse. The pulse-generating circuit also includes a switching device configured to clamp an output voltage of the signal pulse to ground when the output voltage reaches zero volts. Finally, the pulse-generating circuit includes a clipping mechanism configured to clip the output voltage to a predefined constant level, as well as a feedback path configured to return energy from the clipping mechanism to an input of the pulse-generating circuit.

In some embodiments, the pulse-generating circuit also includes a capacitor configured to store the energy from the clipping mechanism prior to returning the energy to the input along the feedback path.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

The disclosed embodiments provide a circuit for generating signal pulses, such as the resonant oscillator circuit described in the above-referenced patent. The pulse-generating circuit and/or resonant oscillator circuit may generate signal pulses that are clipped at a predefined constant level with substantially flat regions at the minimum signal level. Because the pulses exhibit increased duty cycle at the maximum voltage level, the signal pulses may more closely resemble square wave pulses than pulses from other resonant oscillator circuits.

Figure 1:
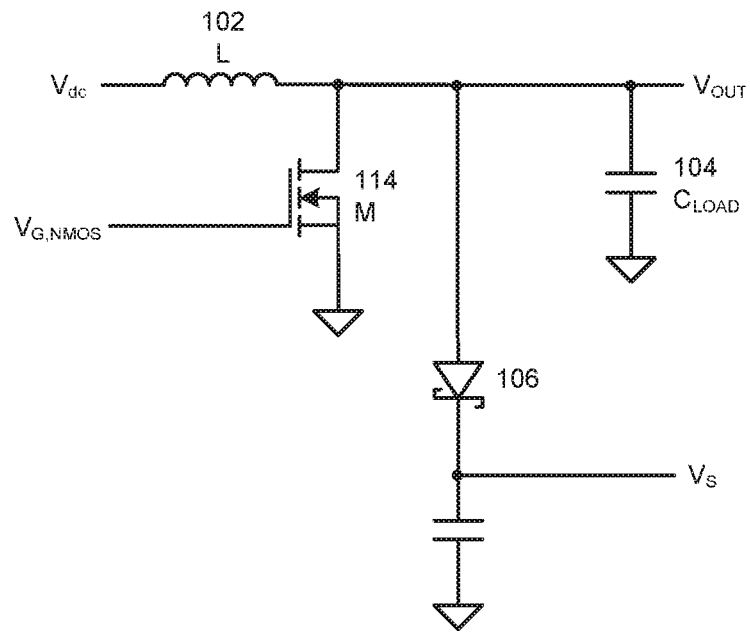
FIG. 1 shows a clipping mechanism in a resonant oscillator circuit in accordance with the disclosed embodiments.

To accomplish the clipping action at the high level, a non-linear clipping mechanism may be introduced to the circuit. As shown in FIG. 1, the clipping mechanism may be a diode 106. The cathode of diode 106 may be tied to a voltage source $V_S$, and the anode of diode 106 may be tied to the signal voltage $V_{OUT}$, which is the voltage across a capacitive load $C_{LOAD}$ 104. $V_{OUT}$ may be clipped because of design constraints on the peak voltage of the circuit. For example, the amplitude of $V_{OUT}$ may be held at a predefined constant level to enable the driving of components such as metal-oxide-semiconductor field-effect-transistors (MOSFETs) in $C_{LOAD}$ 104 with lower maximum operating voltages than the peak amplitude of the signal pulses.

Assuming $V_D$ is the forward voltage drop of diode 106 when diode 106 conducts, when the signal voltage rises to $V_S+V_D$, diode 106 forward-biases and holds the signal voltage $V_{OUT}$ constant while the current of diode 106 decreases to zero. When the current of diode 106 reaches zero, diode 106 becomes reverse-biased, and the voltage across $C_{LOAD}$ 104 begins to decrease toward zero. When the voltage across $C_{LOAD}$ 104 reaches zero, a switch M 114 connected to an inductor L 102 of the circuit turns on, and the sequence repeats.

Figure 2:
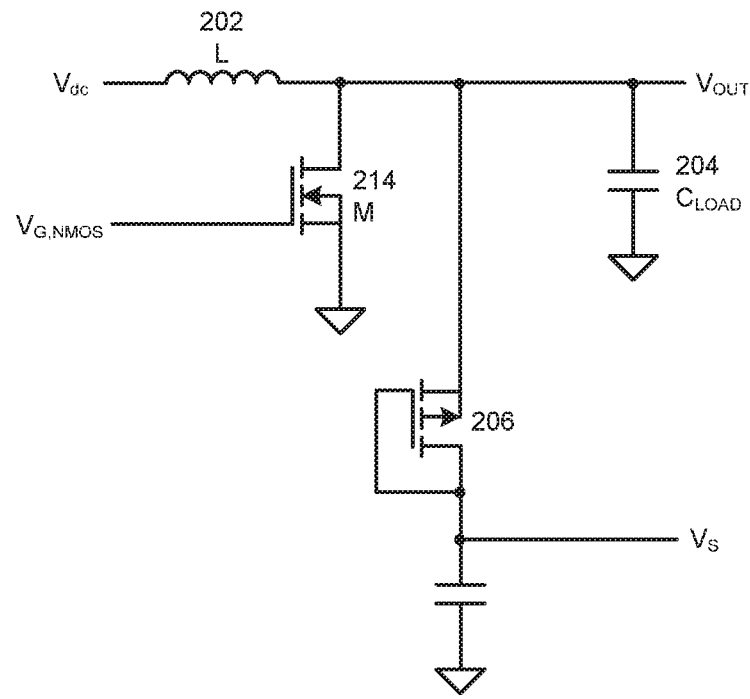
FIG. 2 shows a clipping mechanism in a resonant oscillator circuit in accordance with the disclosed embodiments.

Alternatively, as shown in FIG. 2, a p-channel MOSFET 206 may be used to clip the output voltage of the signal pulse. The drain node of MOSFET 206 is tied to the voltage source $V_S$, the source node is tied to the signal voltage $V_{OUT}$, and the gate is tied to $V_S$.

The action of MOSFET 206 is similar to that of diode 106 of FIG. 1. When the gate-to-source voltage is more negative than one threshold drop $V_{th}$ of MOSFET 206, MOSFET 206 conducts and clips the output voltage $V_{OUT}$ while delivering energy to the voltage source $V_S$. In another embodiment, the gate of MOSFET 206 is actively controlled by a circuit that turns on MOSFET 206 when the voltage reaches $V_S$ and turns off MOSFET 206 when the current flowing through the channel of MOSFET 206 decreases to zero, such that MOSFET 206 behaves as an "ideal diode." Once the voltage across a capacitive load $C_{LOAD}$ 204 reaches zero, a switch M 214 connected to an inductor L 202 of the circuit turns on, and the sequence repeats.

Figure 3:
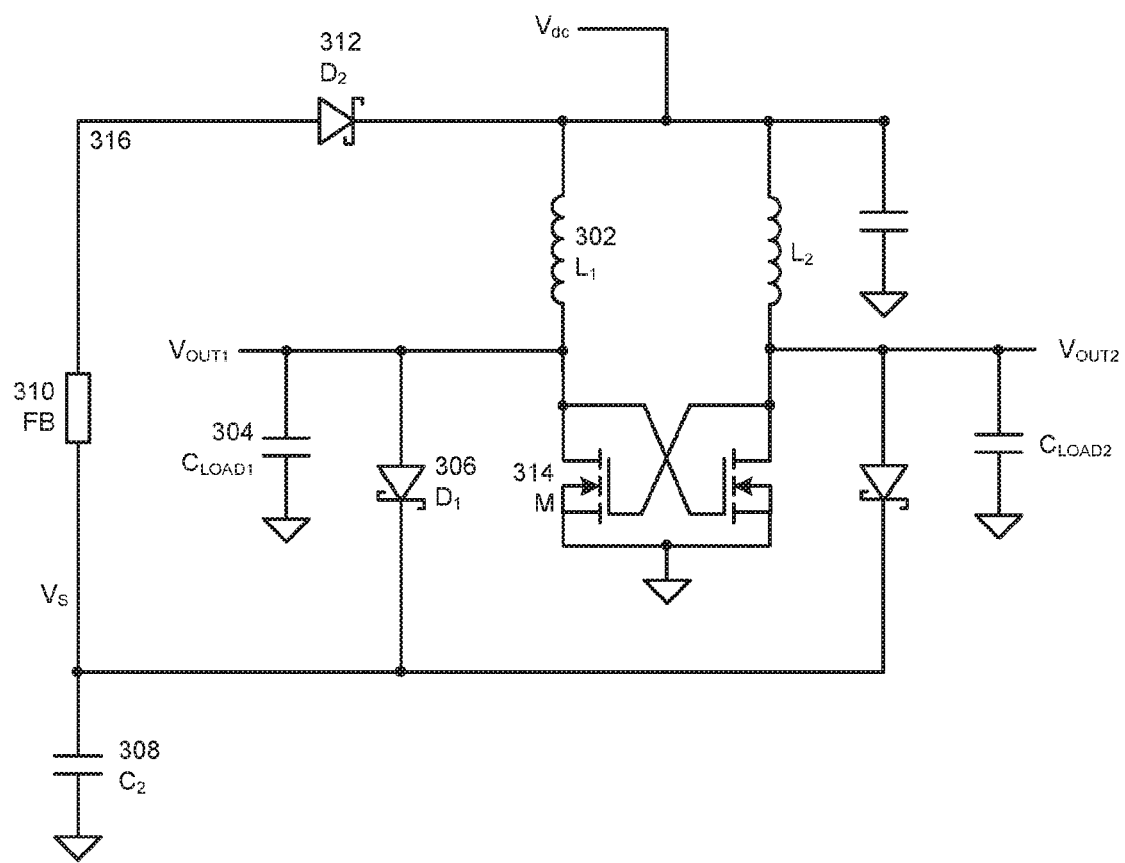
FIG. 3 shows a resonant oscillator circuit in accordance with the disclosed embodiments.

A byproduct of the clipping action is the energy delivered through the clamping device to the voltage source $V_S$. In addition, the efficiency of a system utilizing the circuit may be improved by applying energy from clipping of the signal pulses to an input source elsewhere in the circuit instead of dissipating the energy using the clipping mechanism. As shown in FIG. 3, an input voltage $V_{dc}$ is connected through an inductor $L_1$ 302 to a capacitive load $C_{LOAD1}$ 304. A switch M 314 clamps the output voltage from $L_1$ 302 to ground on the falling edge of each signal pulse when the pulse potential reaches zero volts.

To clip the output voltage of the signal pulses, diode $D_1$ 306 (e.g., a Schottky diode) rectifies the output of $L_1$ 302 and allows a capacitor $C_2$ 308, which acts as the voltage source $V_S$, to charge up to a maximum of one forward diode voltage drop of $D_1$ 306 below the peak voltage of the signal pulses. A feedback path 316 containing a feedback block FB 310 may then pass power from $C_2$ 308 back to the input of the circuit through diode $D_2$ 312.

FB 310 may be implemented in a variety of ways. First, a simple solution for FB 310 may be a Zener diode with the cathode connected to $C_2$ 308 and the anode connected to $D_2$ 312. The Zener diode regulates the voltage on $C_2$ 308 to the sum of the Zener voltage of the Zener diode, the voltage drop across $D_2$ 312, and the pulse generator input voltage $V_{dc}$. $D_2$ 312 prevents forward conduction in the Zener diode along feedback path 316, so that the signal pulses are not limited to the pulse generator input voltage less the Zener diode forward voltage drop. In this solution, the amplitude of the clipped signal pulses may be controlled by selecting the Zener voltage of the Zener diode.

Another solution for FB may be a buck regulator. The buck regulator draws power from $C_2$ 308 at the rectified voltage and outputs power back to the pulse generator input at the regulated voltage. The clipped signal pulse amplitude is not directly controlled and depends on the amount of power used by and passed through the buck regulator.

Figure 4:
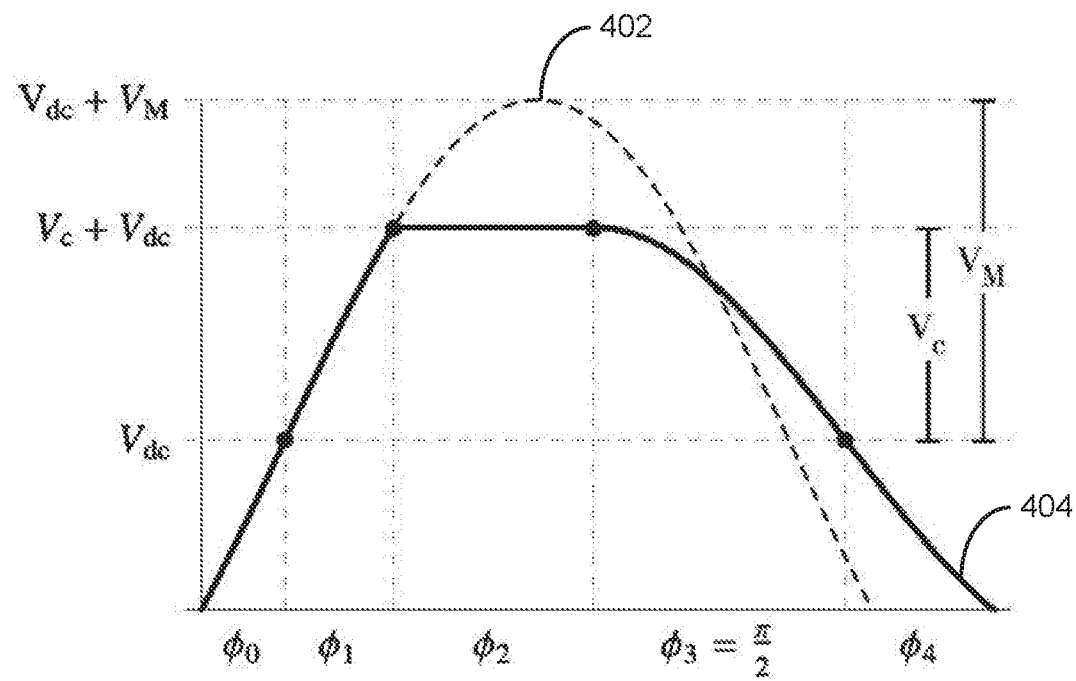
FIG. 4 shows a voltage waveform for a resonant oscillator circuit in accordance with the disclosed embodiments.

The rising and falling edges of the clipped signal waveform are asymmetric. As shown in FIG. 4, the original unclipped signal is represented by a dashed, symmetric waveform 402, while the clipped signal is represented by a solid, asymmetric waveform 404. For both the rising and falling edges, the shape of the edge is a sine wave centered around $V_{dc}$. For the rising edge, the magnitude of the sine wave is given by $V_M$:

$$V_{out}(\theta) = V_{dc} + V_M \sin\theta \qquad (1)$$

where $$V_M = I_M \sqrt{\frac{L}{C}} \qquad (2)$$

$I_M$ is the magnitude of the initial current set by the duration of the on-time for the first switching device (e.g., switch M

314 of FIG. 3). Throughout this discussion angular time is used: $\phi=\omega t$ and $\omega=1/\sqrt{LC}$. In addition, the falling edge is a sine wave of amplitude $V_c$:

$$V_{out}(\theta)=V_{dc}+V_c \sin(\theta+\pi/2) \qquad (3)$$

Referring to FIG. 4, the waveform is divided into five regions:

$\phi_0$: the rising edge from 0V to $V_{dc}$
$\phi_1$: the rising edge from $V_{dc}$ to $V_{dc}+V_c$
$\phi_2$: the flat top region
$\phi_3$: the falling edge from $V_{dc}+V_c$ to $V_{dc}$
$\theta\phi_4$: the falling edge from $V_{dc}$ to 0V Phase angles for the rising edge may then be defined using Equation 1:

$$\sin\phi_0 = \frac{V_{dc}}{V_M} \qquad (4)$$

$$\sin\phi_1 = \frac{V_c}{V_M} \qquad (5)$$

Likewise, using Equation 3, phase angles for the falling edge may be defined:

$$\phi_3 = \pi/2 \qquad (6)$$

$$\sin\phi_4 = \frac{V_{dc}}{V_c} \qquad (7)$$

The phase angle for the flat top, $\phi_2$, is determined by the current at $\phi_1$ flowing through the inductor divided by the voltage drop across the inductor, which is constant. When the voltage reaches $V_{dc}+V_c$, the current equals:

$$I_M \cos\phi_1 = V_M \sqrt{\frac{C}{L}} \cos\phi_1 \qquad (8)$$

The current then drops linearly during interval $T_2$ until the current reaches zero amperes:

$$\frac{V_c}{L} T_2 = I_M \cos\phi_1 \qquad (9)$$

The duration $T_2$ is then:

$$T_2 = \frac{V_M}{V_c} \sqrt{LC} \cos\phi_1 = \sqrt{LC} \frac{\cos\phi_1}{\sin\phi_1} = \sqrt{LC} \cot\phi_1 \qquad (10)$$

Hence, there is a simple relationship between $\phi_2$ and $\phi_1$:

$$\phi_2 = \cot\phi_1 \qquad (11)$$

Note that the preceding analysis pertains to an ideal resonant circuit, neglecting non-idealities such as resistive losses.

The circuitry described above requires a pulse input to the first switching device. As in the case of U.S. Pat. No. 5,559,478, it is possible to use two such circuits for self-oscillation, with the signal output of one circuit driving the gate input of the other circuit and vice versa.

Figure 5:
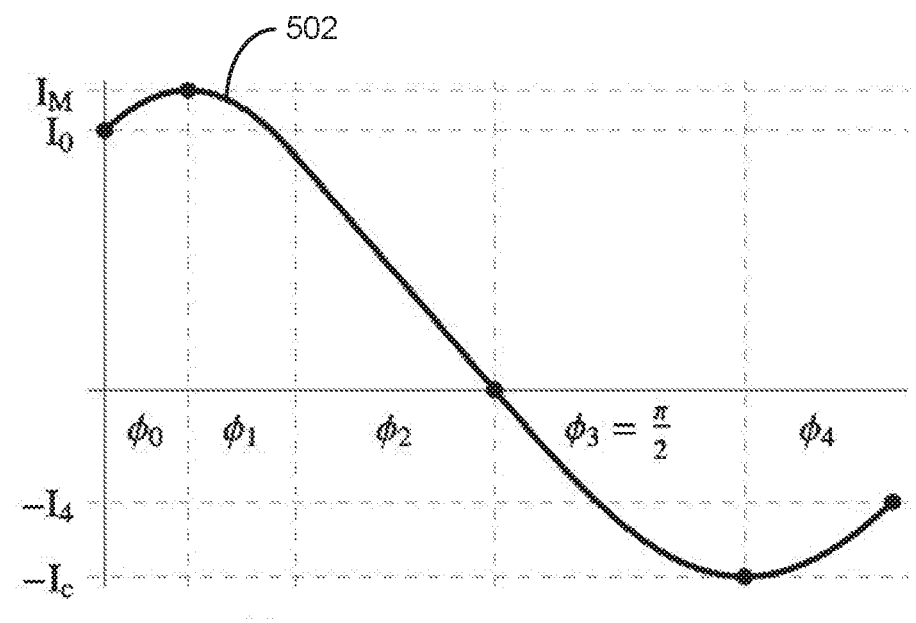
FIG. 5 shows a current waveform for a resonant oscillator circuit in accordance with the disclosed embodiments.

FIG. 5 shows a current waveform 502 for the inductor (e.g., inductor $L_1$ 302 of FIG. 1) current of one of the circuits. At the terminus of the falling edge, the current flowing through the inductor is:

$$I_{NEG} = -\sqrt{\frac{C}{L}} V_c \cos\phi_4 \qquad (12)$$

At the beginning of the rising edge from Equation 8, the current flowing through the inductor is:

$$I_{POS} = \sqrt{\frac{C}{L}} V_M \cos\phi_0 \qquad (13)$$

$$= I_{NEG} + V_{dc} \sqrt{\frac{C}{L}} (\phi_0 + \phi_1 + \phi_2 + \phi_3 + \phi_4)$$

Divide all by $V_{dc}$ and multiply by $\sqrt{LC}$:

$$\cot\phi_0 - \cot\phi_1 + \cot\phi_4 = \phi_0 + \phi_1 + \frac{\pi}{2} + \phi_4 \qquad (14)$$

A useful identity is the following:

$$\sin\phi_1 \sin\phi_4 = \sin\phi_0 \qquad (15)$$

In typical applications, the quantities $V_{dc}$ and $V_c$ are the known inputs. Hence, the value of $\phi_4$ is known and the equation above reduces to one independent variable:

$$\phi_0 = \cot\phi_0 - \sqrt{\left(\frac{\sin\phi_4}{\sin\phi_0}\right)^2 - 1} + \cot\phi_4 - \sin^{-1}\left(\frac{\sin\phi_0}{\sin\phi_4}\right) - \frac{\pi}{2} - \phi_4 \qquad (16)$$

The dependent variable is $V_M$ and can be determined using iterative techniques applied to Equation 14.

Of some interest is the extreme case when $\phi_2$ is zero. If $\phi_2=0$ then from Equation 11:

$$\phi_2 = 0 \Rightarrow \cot\phi_1 = 0 \Rightarrow \phi_1 = \frac{\pi}{2} \qquad (17)$$

And from Equation 14:

$$V_M = V_c \Rightarrow \sin\phi_4 = \sin\phi_0 \Rightarrow \phi_4 = \phi_0 \qquad (18)$$

Equation 14 then reduces to finding the fixed point for:

$$\cot\phi_0 = \phi_0 + \frac{\pi}{2} \qquad (19)$$

with the known solution of $\phi_0 \approx 0.4579$. $\phi_1$ approaches zero as $V_c$ approaches zero. Conversely, $\phi_2$ approaches $\infty$. Hence, the frequency can be slowed down to extremely slow rates simply by setting the clip point slightly above $V_{dc}$.

Of further interest is the case when $V_c=V_{dc}$. The circuit would operate as a voltage doubler.

Finally, the energy delivered at potential $V_c$ is the energy stored in the inductor at phase angle $\phi_1$:

$$E_{out} = \frac{1}{2} C V_M^2 \cos^2\phi_1 = \frac{1}{2} C(V_M^2 - (V_c - V_{dc})^2) \qquad (20)$$

Figure 6:
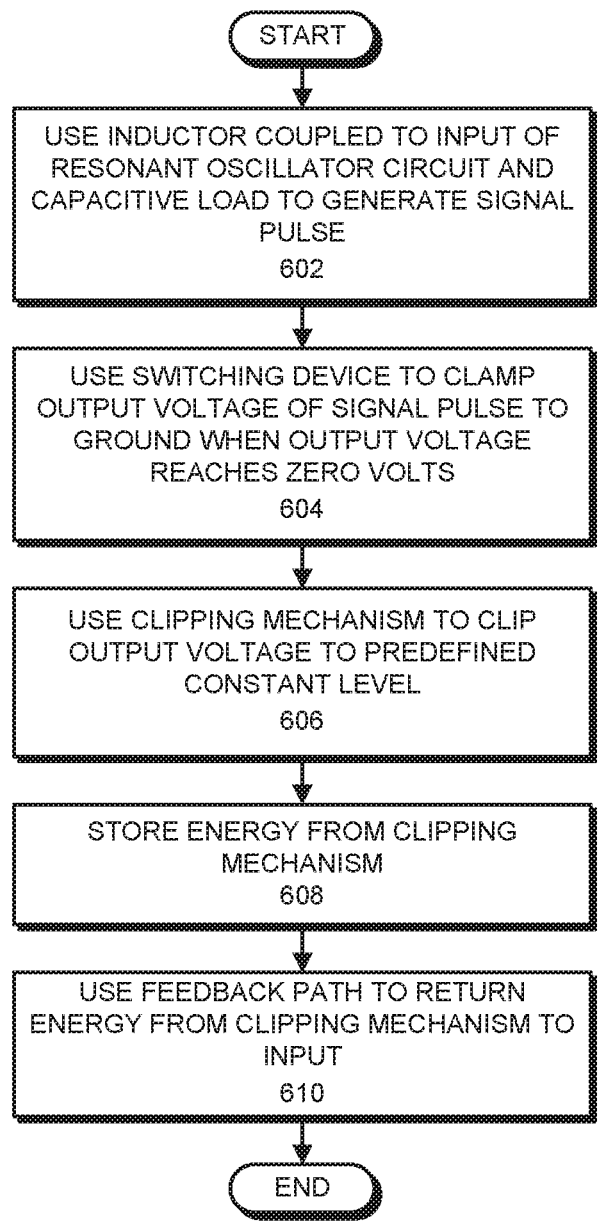
FIG. 6 shows a flowchart illustrating the process of operating a resonant oscillator circuit in accordance with the disclosed embodiments.

FIG. 6 shows a flowchart illustrating the process of operating a resonant oscillator circuit in accordance with the disclosed embodiments. In one or more embodiments, one or more of the steps may be omitted, repeated, and/or performed in a different order. Accordingly, the specific arrangement of steps shown in FIG. 6 should not be construed as limiting the scope of the embodiments.

First, an inductor (e.g., inductor $L_1$ 302 of FIG. 3) coupled to an input (e.g., $V_{dc}$ of FIG. 3) of the resonant oscillator circuit and a capacitive load (e.g., capacitor $C_2$ 308 of FIG. 3) is used to generate a signal pulse (operation 602). Next, a switching device is used to clamp the output voltage of the signal pulse to ground when the output voltage reaches zero volts (operation 604). The signal pulse may thus be separated from the next signal pulse by a substantially flat region at zero volts, as described in the above-referenced patent.

Next, a clipping mechanism is used to clip the output voltage to a predefined constant level (operation 606). The clipping mechanism may be a first diode (e.g., diode 106 of FIG. 1) and/or a MOSFET (e.g., MOSFET 206 of FIG. 2). In addition, the clipping mechanism may allow the signal pulse to conform to design constraints on the peak voltage of the resonant oscillator circuit. For example, the clipping mechanism may clip the output voltage to a maximum operating voltage of a gate of a MOSFET in the capacitive load, thus allowing the MOSFET to be used in the capacitive load in lieu of a larger, more expensive, and/or less efficient MOSFET with a higher maximum operating voltage.

Energy from the clipping mechanism is also stored (operation 608). For example, the energy may be stored by a capacitor (e.g., capacitor $C_2$ 308 of FIG. 3) coupled to the clipping mechanism. The clipping mechanism (e.g., diode $D_1$ 306 of FIG. 3) may rectify the signal pulse prior to enabling charging of the capacitor using the signal pulse.

Finally, a feedback path is used to return energy from the clipping mechanism to the input (operation 610). The feedback path may include a Zener diode and/or a buck regulator that regulate(s) voltage on the capacitor and/or further clip(s) the signal pulse. The feedback path may also include a second diode that prevents forward conduction in the Zener diode so that the signal pulse is not limited to the pulse generator input voltage less the Zener diode forward voltage drop.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A pulse generating circuit having an input terminal configured to receive an input voltage and an output terminal configured to deliver output voltage pulses, the pulse generating circuit comprising:
    an inductor coupled between the input terminal and the output terminal and configured to resonate with a capacitive load to generate the output voltage pulses;
    a switching device configured to clamp the output terminal to ground when an amplitude of an output voltage pulse reaches zero volts;
    a clipping mechanism connected between the output terminal and a capacitor and configured to clip an amplitude of the output voltage pulses to a predefined constant level while delivering energy to the capacitor; and
    a feedback path from the capacitor to the input terminal enabling return of energy delivered to the capacitor to the input terminal, whereby efficiency of the pulse-generating circuit is increased.

2. The pulse generating circuit of claim 1, wherein the clipping mechanism comprises a diode having a cathode coupled to the capacitor and an anode coupled the output terminal.

3. The pulse generating circuit of claim 2, wherein the diode is a Schottky diode.

4. The pulse generating circuit of claim 1, wherein the clipping mechanism comprises a switch coupled between the capacitor and the output terminal.

5. The pulse generating circuit of claim 4, wherein the switch is a p-channel MOSFET having a drain node and a gate node coupled to the capacitor and a source node coupled to the output terminal.

6. The pulse generating circuit of claim 1, wherein the feedback path comprises a Zener diode having a cathode connected to the capacitor and an anode coupled to an anode of a second diode, the second diode having a cathode coupled to the input terminal so as to prevent forward conduction of the Zener diode, wherein the Zener voltage of the Zener diode is selected to control the predefined constant level of the amplitude of the output voltage pulses.

7. The pulse generating circuit of claim 1, wherein the feedback path comprises a buck regulator configured to deliver power from the capacitor to the input terminal.

8. A method of operating a pulse generating circuit having an input terminal configured to receive an input voltage and an output terminal configured to deliver output voltage pulses to a capacitive load, the method comprising:
    using an inductor coupled to the input terminal and the output terminal to resonate with the capacitive load to generate a signal pulse;
    using a switching device to clamp the output terminal to ground when an amplitude of an output voltage pulse reaches zero volts;
    using a clipping mechanism coupled between the output terminal and a capacitor to clip an amplitude of the output voltage pulses to a predefined constant level while delivering energy to the capacitor;
    storing energy from the clipping mechanism in the capacitor; and
    using a feedback path coupled between the capacitor and the input terminal to return energy from the clipping mechanism to the input terminal to improve efficiency of the pulse generating circuit.

9. The method of claim 8, wherein using a clipping mechanism coupled between the output terminal and a capacitor to clip an amplitude of the output voltage pulses to a predefined constant level while delivering energy to the capacitor comprises using a diode having a cathode coupled to the capacitor and an anode coupled the output terminal to rectify an output of the inductor and charge the capacitor.

10. The method of claim 8, wherein using a clipping mechanism coupled between the output terminal and a capacitor to clip an amplitude of the output voltage pulses to a predefined constant level while delivering energy to the capacitor comprises operating a switch coupled between the capacitor and the output terminal to selectively couple the inductor to and charge the capacitor.

11. The method of claim 10, wherein the switch is a p-channel MOSFET having a drain node and a gate node coupled to the capacitor and a source node coupled to the output terminal.

12. The method of claim 8, wherein using a feedback path coupled between the capacitor and the input terminal to return energy from the clipping mechanism to the input terminal to improve efficiency of the pulse generating circuit comprises using a Zener diode having a cathode connected to the capacitor and an anode coupled to an anode of a second diode, the second diode having a cathode coupled to the input terminal so as to prevent forward conduction of the Zener diode, to discharge the capacitor into the input terminal.

13. The method of claim 12, wherein the Zener voltage of the Zener diode is selected to control the predefined constant level of the amplitude of the output voltage pulses.

14. The method of claim 8, wherein the feedback path comprises a buck regulator configured to deliver power from the capacitor to the input terminal.

15. A pulse generating circuit having an input terminal configured to receive an input voltage, first output terminal configured to deliver first output voltage pulses to a first capacitive load, and a second output terminal configured to deliver second output voltage pulses to a second capacitive load, the pulse generating circuit comprising:
 a first inductor coupled between the input terminal and the first output terminal and configured to resonate with the first capacitive load to generate the first output voltage pulses;
 a first switching device configured to clamp the first output terminal to ground when an amplitude of a first output voltage pulse reaches zero volts;
 a first clipping mechanism connected between the first output terminal and a capacitor, the first clipping mechanism configured to clip an amplitude of the first output voltage pulses to a predefined constant level while delivering energy to the capacitor;
 a second inductor coupled between the input terminal and the second output terminal and configured to resonate with the second capacitive load to generate the second output voltage pulses;
 a second switching device configured to clamp the second output terminal to ground when an amplitude of a second output voltage pulse reaches zero volts;
 a second clipping mechanism connected between the second output terminal and the capacitor, the second clipping mechanism configured to clip an amplitude of the first output voltage pulses to a predefined constant level while delivering energy to the capacitor; and
 a feedback path from the capacitor to the input terminal enabling return of energy delivered to the capacitor to the input terminal, whereby efficiency of the pulse-generating circuit is increased.

16. The pulse generating circuit of claim 15, wherein the first clipping mechanism comprises a first diode having a cathode coupled to the capacitor and an anode coupled the first output terminal and the second clipping mechanism comprises a second diode having a cathode coupled to the capacitor and an anode coupled to the second output terminal.

17. The pulse generating circuit of claim 15, wherein the first clipping mechanism comprises a first switch coupled between the capacitor and the first output terminal and the second clipping mechanism comprises a second switch coupled between the capacitor and the second output terminal.

18. The pulse generating circuit of claim 17, wherein the first switch is a p-channel MOSFET having a drain node and a gate node coupled to the capacitor and a source node coupled to the first output terminal and the second switch is a p-channel MOSFET having a drain node and a gate node coupled to the capacitor and a source node coupled to the second output terminal.

19. The pulse generating circuit of claim 15, wherein the feedback path comprises a Zener diode having a cathode connected to the capacitor and an anode coupled to an anode of a second diode, the second diode having a cathode coupled to the input terminal so as to prevent forward conduction of the Zener diode, wherein the Zener voltage of the Zener diode is selected to control the predefined constant level of the amplitude of the output voltage pulses.

20. The pulse generating circuit of claim 15, wherein the feedback path comprises a buck regulator configured to deliver power from the capacitor to the input terminal.

* * * * *